(12) United States Patent
Kerber

(10) Patent No.: US 7,782,074 B2
(45) Date of Patent: Aug. 24, 2010

(54) SYSTEM THAT DETECTS DAMAGE IN ADJACENT DICE

(75) Inventor: Martin Kerber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 216 days.

(21) Appl. No.: 11/857,043

(22) Filed: Sep. 18, 2007

(65) Prior Publication Data

US 2009/0072852 A1 Mar. 19, 2009

(51) Int. Cl.
*G01R 31/26* (2006.01)

(52) U.S. Cl. ........................ 324/765; 324/764

(58) Field of Classification Search .................. None
See application file for complete search history.

(56) References Cited

U.S. PATENT DOCUMENTS

| | | | |
|---|---|---|---|
| 6,043,102 A | 3/2000 | Fang et al. | |
| 6,265,729 B1 | 7/2001 | Nelson et al. | |
| 6,271,539 B1 | 8/2001 | Nelson et al. | |
| 6,326,792 B1 | 12/2001 | Okada | |
| 6,441,397 B2 | 8/2002 | Yamamoto | |
| 6,538,462 B1 | 3/2003 | Lagowski et al. | |
| 6,768,324 B1* | 7/2004 | Yamada et al. | 324/751 |
| 6,963,206 B2 | 11/2005 | Ramappa | |
| 7,602,197 B2* | 10/2009 | Kadyshevitch et al. | 324/751 |
| 2007/0025030 A1 | 2/2007 | Jung | |

* cited by examiner

*Primary Examiner*—Minh N Tang
(74) *Attorney, Agent, or Firm*—Dicke, Billig & Czaja, PLLC

(57) ABSTRACT

A system including a tester configured to measure a first current from a first die of neighboring dice and a second current from a second die of the neighboring dice. The tester is configured to compare the first current to the second current to detect damage in the neighboring dice.

12 Claims, 3 Drawing Sheets

SYSTEM THAT DETECTS DAMAGE IN ADJACENT DICE

BACKGROUND

As product performance requirements continue to increase, manufacturers continue providing semiconductor circuits that have improved performance characteristics. For example, as data rates increase, manufacturers provide more precise filter and oscillator circuits. Usually, these analog circuits, including phase locked loops (PLL), voltage controlled oscillators (VCO), and analog to digital converters, are much more sensitive than digital circuits to noise, component matching, and other short distance variations. In addition, the analog circuits often require calibration to overcome fabrication tolerances.

Typically, the process of fabricating semiconductor circuits includes depositing multiple layers of material, such as semiconductor, dielectric, and conductive material, on a semiconductor wafer. Each of the layers is patterned and etched to form active devices, resistors, capacitors, and other components, which are interconnected to form analog and/or digital circuits. Often, plasma processing is used in depositing materials, etching, pre-cleaning, photo-resist stripping, and ion implantation. Some components are directly exposed to plasma and suffer plasma induced damage, including degradation of dielectric layers. Also, some components are damaged via contamination during processing. The plasma induced damage and/or contamination leads to soft breakdowns and increased leakage currents as compared to the leakage currents of undamaged material.

Circuits are built to operate over a range of fabrication tolerances. Often, one or more calibrations are performed to overcome variations related to fabrication tolerances and to overcome increased leakage currents due to damage that occurred during the fabrication process. If component properties remain unchanged over time, the circuits continue to operate properly. However, time dependent variations in component properties can be fatal to the stability and functioning of the circuits.

The component properties of undamaged components, such as a perfect dielectric film, remain stable over time, but the component properties of damaged components vary or are unstable over time. The damage to dielectric films during the fabrication process leads to current fluctuations, referred to as random telegraphic noise (RTN). In literature, RTN frequently refers to fluctuations of current between the source and drain of a field effect transistor (FET) due to charge traps in the dielectric close to the inversion channel that randomly change their filling state. Herein, RTN refers to the leakage current through the dielectric film. Usually, these current fluctuations are related to damage such as plasma induced damage and/or contamination that occurs during wafer processing. RTN can be fatal, such that it leads to soft failures in the circuits. Since RTN shows up on an irregular basis, detecting RTN can be difficult and may require observation over time, which increases cost. Also, RTN may not be detected during the observation period and show up later.

To reduce circuit failures, the fabrication process can be optimized to reduce plasma induced damage and contamination. However, excessive characterization efforts and changes to the fabrication process can result in a drop in production yields and increase costs. In addition, screening via stability measurements increases costs.

For these and other reasons there is a need for the present invention.

SUMMARY

One embodiment described in the disclosure provides a system including a tester configured to measure a first current from a first die of neighboring dice and a second current from a second die of the neighboring dice. The tester is configured to compare the first current to the second current to detect damage in the neighboring dice.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
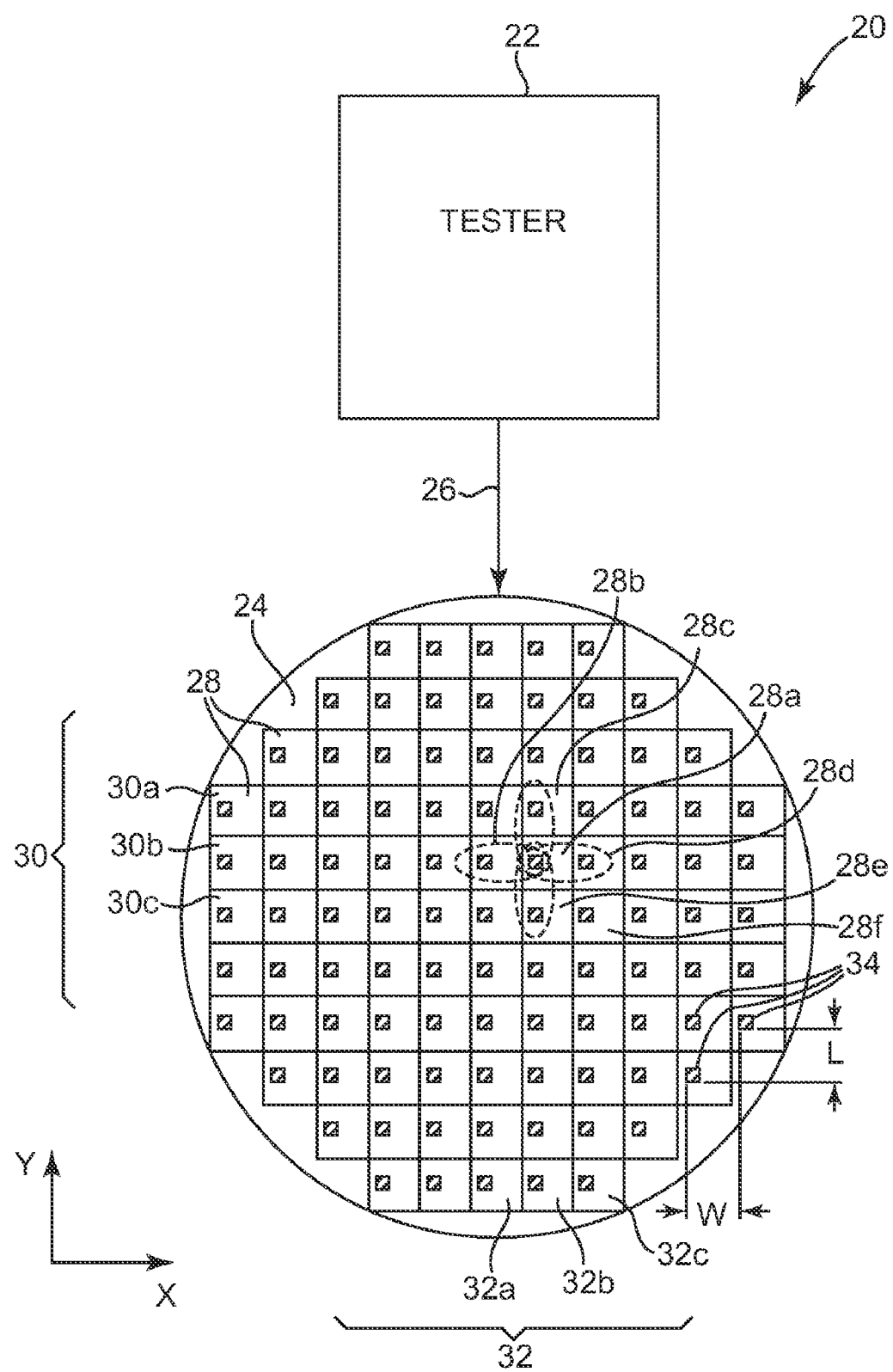
FIG. 1 is a diagram illustrating one embodiment of a test system according to the present invention.

FIG. 1 is a diagram illustrating one embodiment of a test system 20 according to the present invention. Test system 20 includes a tester 22 that tests semiconductor wafers, such as semiconductor wafer 24 via test path 26. Semiconductor wafer 24 includes semiconductor dice 28 and tester 20 tests each of the semiconductor dice 28 on wafer 24 via test path 26.

Semiconductor dice 28 are arranged in rows 30 that extend in the x-direction and columns 32 that extend in the y-direction. Neighboring rows 30 are situated adjacent to each other, such as neighboring rows 30a and 30b and neighboring rows 30b and 30c. Neighboring columns 32 are situated adjacent to each other, such as neighboring columns 32a and 32b and neighboring columns 32b and 32c. Each of the semiconductor dice 28 is adjacent one or more semiconductor dice 28 in one or more neighboring rows and one or more neighboring columns. Adjacent semiconductor dice 28 are referred to as neighboring dice. For example, semiconductor dice 28a-28e are neighboring dice, where semiconductor die 28a is a neighboring die, i.e. adjacent, to neighboring dice 28b-28e as indicated via dashed lines. In other embodiments, adjacent dice, referred to as neighboring dice, include semiconductor dice 28 at the corners of a semiconductor die, such as semiconductor dice 28a and 28f.

Tester 22 measures a first leakage current from one of the neighboring dice and a second leakage current from another one of the neighboring dice. Tester 22 compares the first and second leakage currents to detect damage in one of the neighboring dice. If the difference between the first and second leakage currents is greater than a next neighbor variation value, one of the measured neighboring dice is damaged. The neighboring die that provided the larger leakage current is the damaged semiconductor die 28. In one embodiment, a third leakage current from another neighboring dice is measured and compared to the leakage current value from the damaged semiconductor die to confirm the result.

For example, in one embodiment, tester 22 measures a first leakage current from semiconductor die 28a and a second leakage current from semiconductor die 28b. If the difference between the first and second leakage currents is greater than a next neighbor variation value, one of the semiconductor dice 28a and 28b is damaged. If first leakage current is greater than second leakage current, semiconductor die 28a is the damaged semiconductor die. In one embodiment, tester 22 then measures a third leakage current from semiconductor die 28c. If the difference between the first and third leakage currents is greater than a next neighbor variation value and the first leakage current is greater than the third leakage current, the initial result is confirmed and semiconductor die 28a is a damaged semiconductor die.

Short range variations in materials on a semiconductor wafer due to fabrication tolerances are smaller than global variations, such as center to edge variations, wafer to wafer variations, and lot to lot variations. The shorter the distance between measured and compared components, the smaller the fabrication tolerance is scattered between components. Damaged semiconductor dice 28 that exhibit larger leakage currents are detected via next neighbor variation values or next neighbor screening margins that are smaller than the global variation values or global screening margins. Semiconductor dice 28 that provide the larger leakage currents have already received soft breakdowns via plasma induced damage and/or contamination and are at a higher risk of providing RTN. The next neighbor comparison test identifies the time-zero damaged semiconductor dice 28 that can be screened out and either discarded or fixed. In one embodiment, the damaged semiconductor dice 28 are marked as damaged and discarded. In one embodiment, the damaged semiconductor dice 28 are fixed via disconnecting the damaged device or component and substituting in an undamaged device or component.

Each of the semiconductor dice 28 includes a component 34 that is tested during next neighbor testing. Tester 22 measures the leakage currents through the components 34 in neighboring dice and compares the measured leakage currents to detect one or more damaged semiconductor dice 28 in the neighboring dice. In semiconductor wafer 24, each of the components 34 is one die width W from a neighboring component 34 or one die length L from a neighboring component 34. These are much smaller distances than center-to-edge distances or edge-to-edge distances and the next neighbor variation value used for screening can be much smaller than the global variation value. In one embodiment, the distance between measured components 34 is less than one die width W and less than one die length L. In other embodiments, component elements are combined to provide one of the components 34 and leakage currents are measured through each of the component elements and compared to detect damaged elements such that smaller next element variation values are used for screening.

In one embodiment, each of the components 34 includes a dielectric film and tester 22 measures the leakage current through the dielectric film during next neighbor testing. In one embodiment each of the components 34 includes an oxide layer and tester 22 measures the leakage current through the oxide layer during next neighbor testing. In one embodiment, each of the components 34 is a capacitor and tester 22 measures the leakage current through the capacitor during next neighbor testing. In one embodiment, each of the components 34 is a capacitor including a dielectric film and tester 22 measures the leakage current through the dielectric film during next neighbor testing. In another embodiment, tester 22 detects leakage current fluctuations through a component 34 to detect damage in the neighboring dice.

Tester 22 screens semiconductor dice 28 on wafer 24 via next neighbor testing to detect semiconductor dice 28 that are damaged in the fabrication process, such as by plasma induced damage and/or contamination. The damaged semiconductor dice 28 are susceptible to current fluctuations or RTN that result in soft failures. The damaged semiconductor dice 28 are marked as damaged and thrown out or fixed to provide undamaged semiconductor dice 28 that are substantially not susceptible to RTN.

Figure 2:
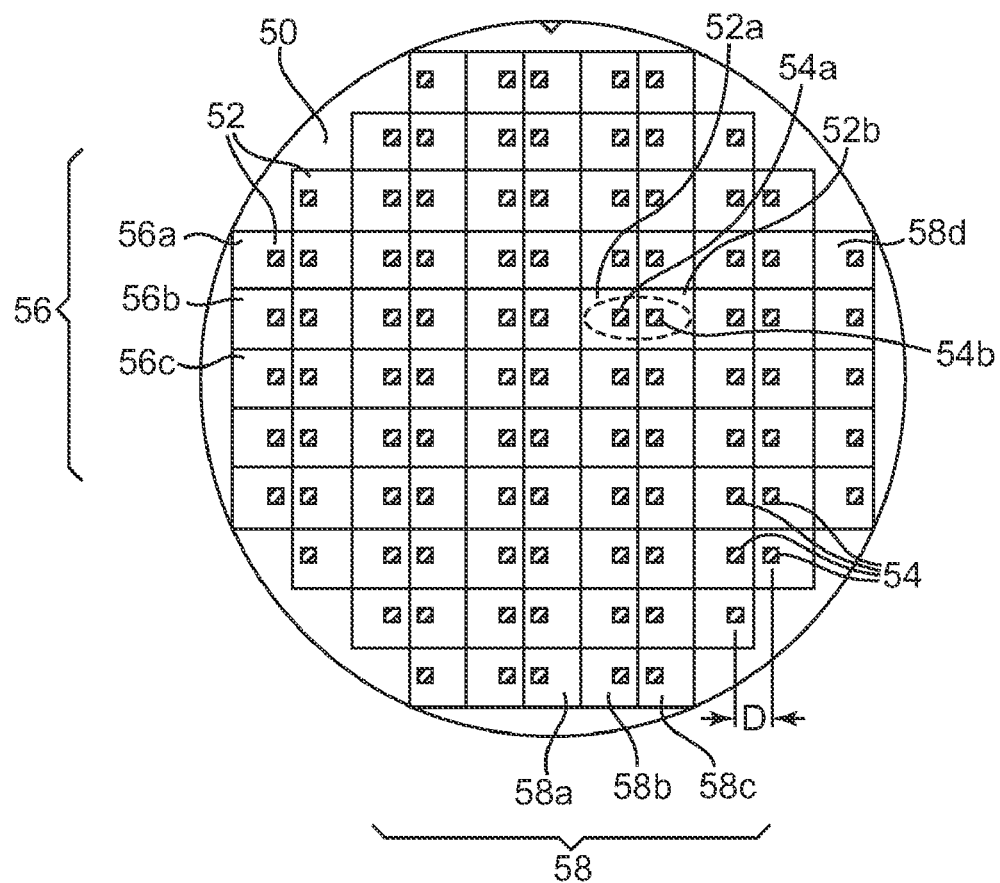
FIG. 2 is a diagram illustrating one embodiment of a semiconductor wafer that includes semiconductor dice rotated to reduce the distance between measured components.

FIG. 2 is a diagram illustrating one embodiment of a semiconductor wafer 50 that includes semiconductor dice 52 rotated to reduce the distance between measured components 54. The semiconductor dice 52 are arranged in rows 56 that extend in the x-direction and columns 58 that extend in the y-direction. Neighboring rows 56 are situated adjacent to each other, such as neighboring rows 56a and 56b and neighboring rows 56b and 56c. Neighboring columns 58 are situated adjacent to each other, such as neighboring columns 58a and 58b and neighboring columns 58b and 58c. Each of the semiconductor dice 52 is adjacent one of the semiconductor dice 52 in a neighboring column 58, except semiconductor dice 52 in the right most column 58d. Adjacent semiconductor dice 52 in adjacent columns 58, referred to as neighboring dice, include adjacent components 54, referred to as neighboring components. For example, semiconductor dice 52a and 52b are neighboring dice that have neighboring components 54a and 54b, as indicated via the dashed line. In other embodiments, semiconductor dice 52 are rotated such that substantially each of the semiconductor dice 52 is a neighboring die to a semiconductor die 52 in a neighboring row 56.

Tester 22 (shown in FIG. 1) measures a first leakage current from one of the neighboring dice and a second leakage current from another one of the neighboring dice. Tester 22 compares the first and second leakage currents to detect damage in one of the neighboring dice. If the difference between the first and second leakage currents is greater than a next neighbor variation value, one of the measured neighboring dice is damaged. The neighboring die that provided the larger leakage current is the damaged semiconductor die 52.

For example, in one embodiment, tester 22 measures a first leakage current from semiconductor die 52a and a second leakage current from semiconductor die 52b. If the difference between the first and second leakage currents is greater than a next neighbor variation value, one of the semiconductor dice 52a and 52b is damaged. If first leakage current is greater than second leakage current, semiconductor die 52a is the damaged semiconductor die.

Each of the semiconductor dice 52 includes a component 54 that is tested during next neighbor testing. Tester 22 measures the leakage currents through the components 54 in neighboring dice and compares the measured leakage currents to detect a damaged semiconductor die 52 in the neighboring dice. The components 54 are similar to components 34 (shown in FIG. 1).

In one embodiment, each of the components 54 includes a dielectric film and tester 22 measures the leakage current through the dielectric film during next neighbor testing. In one embodiment each of the components 54 includes an oxide layer and tester 22 measures the leakage current through the oxide layer during next neighbor testing. In one embodiment, each of the components 54 is a capacitor and tester 22 measures the leakage current through the capacitor during next neighbor testing. In one embodiment, each of the components 54 is a capacitor including a dielectric film and tester 22 measures the leakage current through the dielectric film during next neighbor testing. In one embodiment, tester 22 detects leakage current fluctuations through a component 54 to detect damage in the neighboring dice.

To reduce the distance between measured components 54 in semiconductor wafer 50, each of the components 54 is located at the edge of a semiconductor die 52 and the neighboring die is rotated 180 degrees, on the reticle, from the original semiconductor die 52. The next neighbor distance D is reduced to two times the separation distance of the component 54 from the edge or boundary of the semiconductor die 52. The distance D is much smaller than center-to-edge distance or edge-to-edge distance and the next neighbor variation value used for screening can be much smaller than the global variation value. Also, the distance D is smaller than die width W and die length L such that smaller next neighbor variation values can be used for screening.

Tester 22 screens semiconductor dice 52 on wafer 50 via next neighbor testing to detect semiconductor dice 52 that are damaged in the fabrication process, such as by plasma induced damage and/or contamination. The damaged semiconductor dice 52 are susceptible to current fluctuations or RTN that result in soft failures. The damaged semiconductor dice 52 are marked as damaged and thrown out or fixed to provide undamaged semiconductor dice 52 that are substantially not susceptible to RTN.

Figure 3:
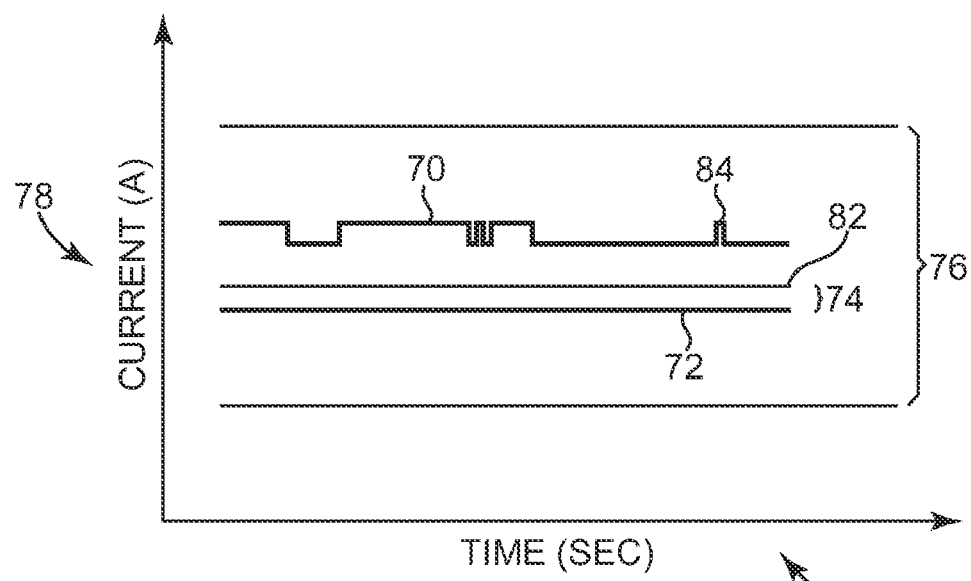
FIG. 3 is a graph of a first leakage current and a second leakage current during functional testing via one embodiment of a tester.

FIG. 3 is a graph of a first leakage current 70 and a second leakage current 72 during functional testing via one embodiment of tester 22. The first leakage current 70 and the second leakage current 72 are measured from components and semiconductor dice, such as components 34 or 54 and semiconductor dice 28 or 52 (shown in FIGS. 1 and 2). Tester 22 compares the first leakage current 70 and the second leakage current 72 to a next neighbor variation value or screening margin 74, which is much smaller than the global variation value or screening margin 76. The leakage currents 70 and 72 are graphed in amperes (A) at 78 versus time in seconds (SEC) at 80.

Tester 22 measures the first leakage current 70 and the second leakage current 72 during functional testing. In this example, the second leakage current 72 is constant and smaller than the first leakage current 70. The lower end of the next neighbor variation value 74 is set at the second leakage current 72. The first leakage current 70 is inside the larger global variation value 76, but clearly outside the next neighbor variation value 74, where the top end 82 of the next neighbor variation value 74 is lower than the first leakage current 70. Thus, the component and semiconductor die that provided the first leakage current 70 fail the next neighbor leakage current test. Failing the next neighbor test substantially indicates that the component and semiconductor die were damaged during the fabrication process, such as by plasma induced damage and/or contamination. The failed semiconductor die is either discarded or fixed via substitution of an undamaged component.

In one embodiment, tester 22 measures the first leakage current 70 and detects current fluctuations at 84 in an extended functional test. The component and semiconductor die that provided the first leakage current 70 fail the leakage current test and the failed semiconductor die is either discarded or fixed via substitution of an undamaged component. However, extended functional testing is time consuming and increases costs.

The leakage current tests detect semiconductor dice 28 or 52 that were damaged in the fabrication process, such as by plasma induced damage and/or contamination. The next neighbor tests detect damaged semiconductor dice 28 or 52 via next neighbor variation values, such as next neighbor variation value 74, which are smaller than the global variation values, such as global variation value 76. Damaged semiconductor dice 28 or 52 detected via a next neighbor variation value may not be detected via the larger global variation value.

Figure 4:
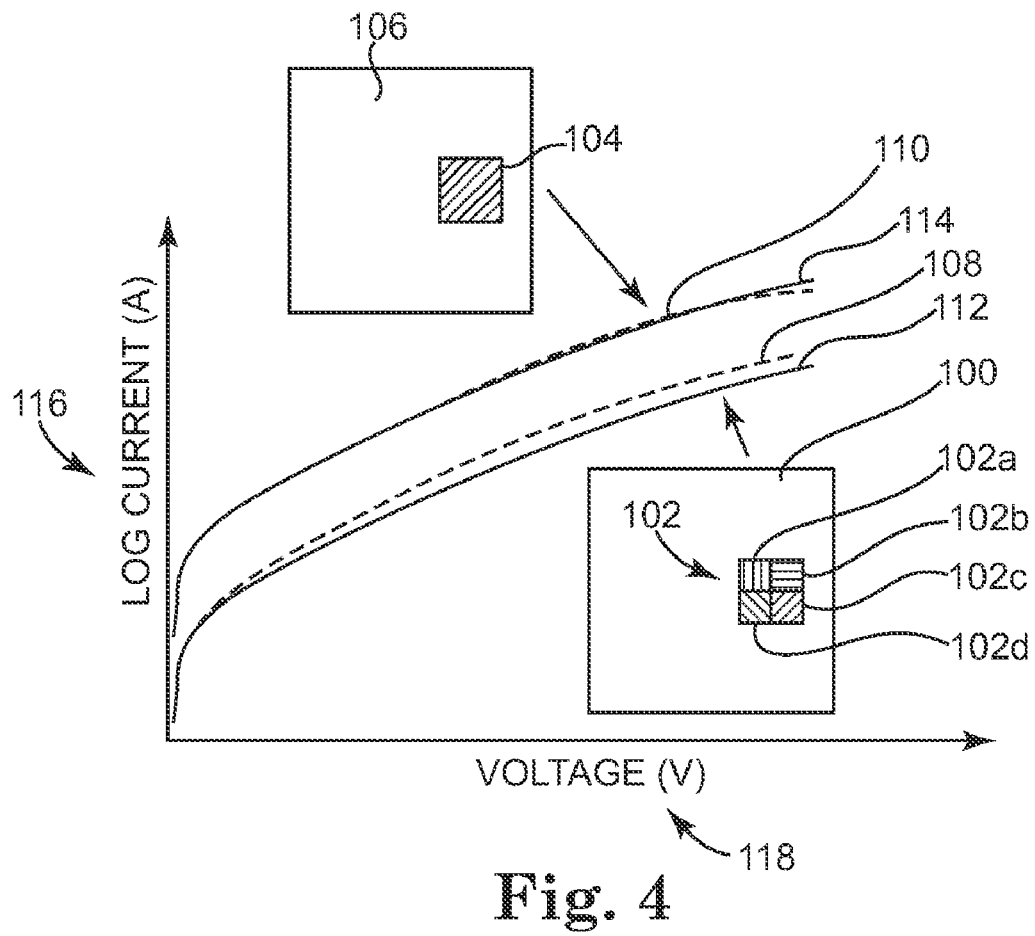
FIG. 4 is a diagram illustrating one embodiment of a semiconductor die that includes a component divided into four component elements.

FIG. 4 is a diagram illustrating one embodiment of a semiconductor die 100 that includes a component 102 divided into four component elements 102a-102d to reduce the distance between measured items and provide on-die leakage current comparisons. FIG. 4 is also a graph that illustrates the increased sensitivity of leakage current measurements taken through one of the component elements 102a-102d, as compared to leakage current measurements taken through an undivided second component 104 in a second semiconductor die 106.

First component 102 is divided into four adjacent neighboring component elements 102a-102d to reduce the distance between measured items and the variations due to fabrication tolerances. Each of the component elements 102a-102d is one fourth of first component 102 and provides substantially one fourth of the total leakage current through first component 102. Second component 104 is not divided into component elements and provides a leakage current that is similar to the total leakage current through first component 102.

Dividing component 102 into four component elements 102a-102d is one example of dividing a component into multiple component elements to increase sensitivity. A component can be divided into any suitable number of component elements, such as two or more component elements, to increase sensitivity. In addition, if a single product includes multiple components, next neighbor comparisons can be done on the components in one product to increase sensitivity. In other embodiments, first component 102 is divided into any suitable number of component elements, such as two or more component elements.

Tester 22 (shown in FIG. 1) measures a first leakage current from one of the neighboring component elements 102a-102d and a second leakage current from another one of the neighboring component elements 102a-102d. Tester 22 compares the first and second leakage currents to detect damage in one of the neighboring component elements 102a-102d. If the difference between the first and second leakage currents is greater than a next neighboring element variation value, one of the measured neighboring component elements 102a-102d is damaged. The component element 102a-102d that provided the larger leakage current is the damaged component element 102a-102d. In one embodiment, a third leakage current from another neighboring component element 102a-102d is measured and compared to the leakage current value from the damaged component element 102a-102d to confirm the result.

For example, in one embodiment, tester 22 measures a first leakage current from component element 102a and a second leakage current from component element 102b. If the difference between the first and second leakage currents is greater than a next neighboring element variation value, one of the neighboring component elements 102a and 102b is damaged. If first leakage current is greater than second leakage current, component element 102a is the damaged neighboring component element. In one embodiment, tester 22 then measures a third leakage current from component element 102c. If the difference between the first and third leakage currents is greater than a next neighboring element variation value and the first leakage current is greater than the third leakage current, the initial result is confirmed and component element 102a is a damaged component element.

In one embodiment, tester 22 detects a damaged component element in a semiconductor die, such as component element 102a in semiconductor die 100, and tester 22 marks the semiconductor die as a failure. In one embodiment, tester 22 detects a damaged component element in a semiconductor die, such as component element 102a in semiconductor die 100, and tester 22 programs in a substitute good component element, such as component element 102e (not shown), to make up a whole component, such as component 102.

In one embodiment, each of the component elements 102a-102d includes a dielectric film and tester 22 measures the leakage current through the dielectric film during next neighbor testing. In one embodiment, each of the component elements 102a-102d includes an oxide layer and tester 22 measures the leakage current through the oxide layer during next neighbor testing. In one embodiment, component 102 is a capacitor and tester 22 measures the leakage current through each of the component elements 102a-102d during next neighbor testing. In one embodiment, component 102 is a capacitor including a dielectric film and tester 22 measures the leakage current through the dielectric film in each of the component elements 102a-102d during next neighbor testing. In one embodiment, tester 22 detects leakage current fluctuations through each of the component elements 102a-102d to detect damage in neighboring component elements 102a-102d.

To reduce the distance between measured items and provide on-die leakage current comparisons, component 102 is divided into multiple component elements 102a-102d. The next neighbor distance is reduced to fractions of the length or width of component 102, which is much smaller than die-to-die distances, center-to-edge wafer distances, or edge-to-edge wafer distances. Therefore, the next neighboring element variation values used for screening can be much smaller than the next neighbor variation values used for components on separate dice and the global variation values.

The graph illustrates a first leakage current 108 through one of the component elements 102a-102d and a second leakage current 110 through the second component 104. The first and second leakage currents 108 and 110 are graphed on a logarithmic current scale in amperes (A) at 116 versus voltage in volts (V) at 118. First leakage current 108 is a leakage current through a damaged component element 102a-102d and second leakage current 110 (shown via a dashed line) is a leakage current through a damaged second component 104. First leakage current 108 is easily distinguishable from the average leakage current 112 through undamaged component elements similar to component elements 102a-102d, while second leakage current 110 is difficult to distinguish from the average leakage current 114 through undamaged components similar to second component 104. This illustrates the increased sensitivity of leakage current measurements taken through one of the component elements 102a-102d, as compared to leakage current measurements taken through undivided components, such as second component 104.

Figure 5:
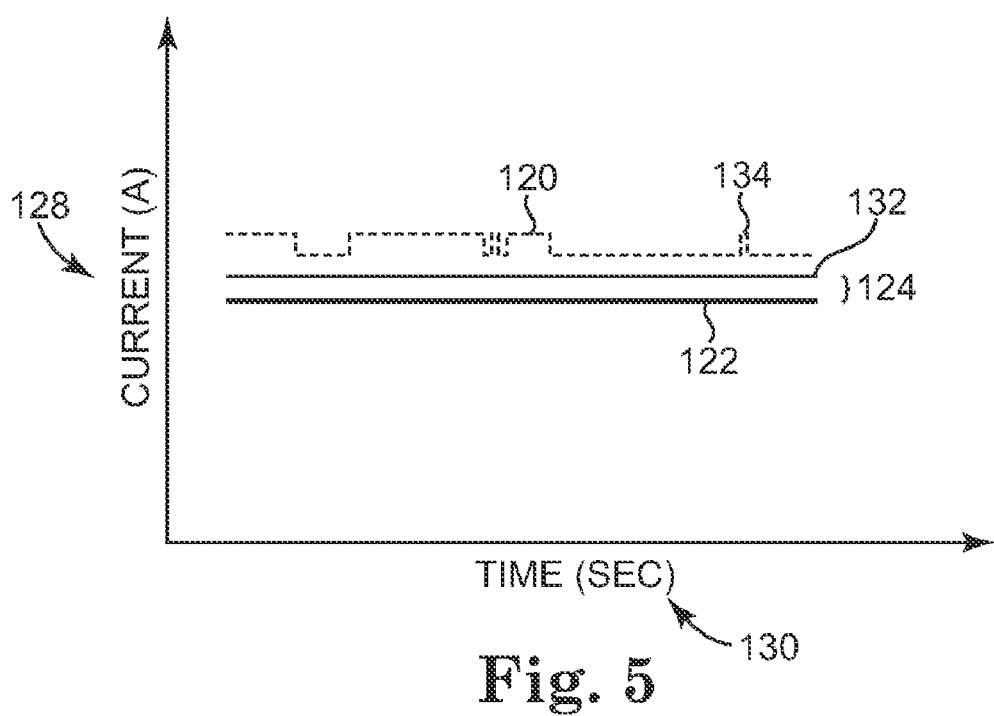
FIG. 5 is a graph of a first leakage current and a second leakage current during functional tester of component elements.

FIG. 5 is a graph of a first leakage current 120 and a second leakage current 122 during functional testing via one embodiment of tester 22. The first leakage current 120 and the second leakage current 122 are measured from component elements of a component in a semiconductor die, such as component elements 102a-102d of component 102 in semiconductor die 100. Tester 22 compares the first leakage current 120 and the second leakage current 122 to a next neighboring element variation value or screening margin 124, which can be much smaller than the next neighbor variation value for die-to-die comparisons or a global variation value. The leakage currents 120 and 122 are graphed in amperes (A) at 128 versus time in seconds (SEC) at 130.

Tester 22 measures the first leakage current 120 and the second leakage current 122 during functional testing. In this example, the second leakage current 122 is constant and smaller than the first leakage current 120. The lower end of the next neighbor variation value 124 is at the second leakage current 122. The first leakage current 120 is outside the next neighboring element variation value 124, where the top end 132 of the next neighboring element variation value 124 is lower than the first leakage current 120. Thus, the component element that provided the first leakage current 120 fails the next neighbor leakage current test. Failing the next neighbor test substantially indicates that the component element was damaged during the fabrication process, such as by plasma induced damage and/or contamination. The failed component element is discarded and the semiconductor die is either discarded or fixed via substitution of an undamaged component element.

In one embodiment, tester 22 measures the first leakage current 120 and detects current fluctuations at 134 in an extended functional test. The component element that provided the first leakage current 120 fails the leakage current test and the failed component element is discarded. The semiconductor die is either discarded or fixed via substitution of an undamaged component element. However, extended functional testing is time consuming and increases costs.

The next neighbor tests, including the next neighboring die and the next neighboring element leakage current tests, detect semiconductor dice that were damaged in the fabrication process, such as by plasma induced damage and/or contamination. These next neighbor tests detect damaged semiconductor dice via next neighbor variation values, such as next neighbor variation value 74 and next neighboring element variation value 124, which are smaller than the global variation values. Damaged semiconductor dice detected via a next neighbor variation value or a next neighboring element variation value may not be detected via a larger global variation value.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
a tester configured to measure a first current from a first die of adjacent dice and a second current from a second die of the adjacent dice and to compare the first current to the second current to detect damage in the adjacent dice, wherein the adjacent dice are part of a wafer including first dice in a first column of neighboring columns and second dice in a second column of the neighboring columns, wherein the first dice are rotated 180 degrees from the second dice.

2. The system of claim 1, wherein the tester is configured to measure a third current from a third die of the adjacent dice.

3. The system of claim 2, wherein the tester is configured to compare the first current and the second current and the third current to detect damage in the adjacent dice.

4. The system of claim 1, wherein the tester is configured to compare the first current and the second current to a neighbor variation value.

5. The system of claim 1, wherein the tester is configured to compare the difference between the first current and the second current to a neighbor variation value and if the difference between the first current and the second current is greater than the neighbor variation value, the tester indicates that one of the first die and the second die is a damaged die.

6. The system of claim 5, wherein the damaged die provides the larger one of the first current and the second current.

7. The system of claim 1, wherein the tester is configured to detect fluctuations in the first current and the second current to detect damage in the adjacent dice.

8. The system of claim 1, wherein the first current flows through a first oxide layer and the second current flows through a second oxide layer.

9. A system comprising:
a tester configured to measure current from neighboring dice and obtain measured currents and to compare the measured currents to detect damage in the neighboring dice, wherein the neighboring dice are part of a wafer including first dice in a first column of neighboring columns and second dice in a second column of the neighboring columns, wherein the first dice are rotated 180 degrees from the second dice.

10. The system of claim 9, wherein the tester is configured to measure current from the neighboring dice in adjacent columns and to compare the measured currents from the neighboring dice in the adjacent columns to detect damage in the neighboring dice.

11. The system of claim 9, wherein the tester is configured to compare the difference between the measured currents to a neighbor variation value and if the difference between the measured currents is greater than the neighbor variation value, the tester indicates that one of the neighboring dice is a damaged die.

12. The system of claim 11, wherein the damaged die provides the largest one of the measured currents.

* * * * *